(12) United States Patent
Bradley et al.

(10) Patent No.: US 8,878,162 B2
(45) Date of Patent: Nov. 4, 2014

(54) METHOD OF DEPOSITING ORGANIC LAYERS ONTO A SUBSTRATE

(75) Inventors: Donal Bradley, Beaconsfield (GB); Lichun Chen, Linkoping (BE); Patrick Dagenaar, London (GB)

(73) Assignee: Imperial Innovations Limited, London (GB)

( * ) Notice: Subject to any disclaimer, the term of this patent is extended or adjusted under 35 U.S.C. 154(b) by 1497 days.

(21) Appl. No.: 12/525,264

(22) PCT Filed: Jan. 31, 2008

(86) PCT No.: PCT/GB2008/000324
§ 371 (c)(1),
(2), (4) Date: May 7, 2010

(87) PCT Pub. No.: WO2008/093090
PCT Pub. Date: Aug. 7, 2008

(65) Prior Publication Data
US 2010/0219401 A1  Sep. 2, 2010

(30) Foreign Application Priority Data

Jan. 31, 2007 (GB) .................................. 0701909.4

(51) Int. Cl.
*H01L 29/08* (2006.01)
*B82Y 10/00* (2011.01)
*G03F 7/00* (2006.01)
*B82Y 40/00* (2011.01)
*H01L 51/00* (2006.01)
*H01L 51/42* (2006.01)

(52) U.S. Cl.
CPC ............. *B82Y 10/00* (2013.01); *H01L 51/0004* (2013.01); *G03F 7/0002* (2013.01); *Y02E 10/549* (2013.01); *H01L 51/0013* (2013.01); *B82Y 40/00* (2013.01); *H01L 51/0026* (2013.01); *H01L 51/424* (2013.01); *H01L 51/4253* (2013.01)
USPC .......................... 257/40; 438/99; 257/E51.001

(58) Field of Classification Search
USPC ................................. 257/40, E51.001; 438/99
See application file for complete search history.

(56) References Cited

U.S. PATENT DOCUMENTS 5,512,131 A * 4/1996 Kumar et al. .................. 438/738
5,776,748 A * 7/1998 Singhvi et al. ................ 435/180

(Continued)

FOREIGN PATENT DOCUMENTS

EP    1541524 A2    6/2005
WO    WO2004006291    1/2004

(Continued)

OTHER PUBLICATIONS

Tan, L. et al., "Imprinting of polymer at low temperature and pressure" Journal of Vacuum Science and Technology: Part B, AVS / AIP, Melville, New York, NY, US. vol. 22, No. 5, Oct. 13, 2004, pp. 2486-2492, XP012074653. ISSN: 1071-1023, p. 2487, col. 2; p. 2489, col. 2; p. 2490, col. 1.

(Continued)

*Primary Examiner* — Caleb Henry
(74) *Attorney, Agent, or Firm* — Reinhart Boerner Van Deuren s.c.

(57) ABSTRACT

A method for depositing one or more organic layers onto a substrate, which includes: transferring the one or more layers from a depositing surface of a stamp to the substrate by bringing the layer coated depositing surface of the stamp into contact with the substrate, and the use of either or both of the steps of: (i) contacting the polymer with a plasticizer; and (ii) heating the substrate and/or stamp, in order to create favorable conditions for conformal contact and uniform layer transfer.

47 Claims, 7 Drawing Sheets

(56) References Cited

U.S. PATENT DOCUMENTS

| | | | |
|---|---|---|---|
| 5,817,242 A * | 10/1998 | Biebuyck et al. | 216/41 |
| 5,937,758 A * | 8/1999 | Maracas et al. | 101/327 |
| 5,976,826 A * | 11/1999 | Singhvi et al. | 435/29 |
| 6,027,595 A * | 2/2000 | Suleski | 156/230 |
| 6,180,239 B1 * | 1/2001 | Whitesides et al. | 428/411.1 |
| 6,309,580 B1 * | 10/2001 | Chou | 264/338 |
| 6,368,838 B1 * | 4/2002 | Singhvi et al. | 435/177 |
| 6,380,101 B1 * | 4/2002 | Breen et al. | 438/765 |
| 6,518,168 B1 * | 2/2003 | Clem et al. | 438/623 |
| 6,673,287 B2 * | 1/2004 | Breen et al. | 264/83 |
| 6,780,492 B2 * | 8/2004 | Hawker et al. | 428/198 |
| 6,792,856 B2 * | 9/2004 | Hall et al. | 101/368 |
| 6,860,956 B2 * | 3/2005 | Bao et al. | 156/232 |
| 6,887,332 B1 * | 5/2005 | Kagan et al. | 427/97.3 |
| 7,067,306 B2 * | 6/2006 | Singhvi et al. | 435/283.1 |
| 7,117,790 B2 * | 10/2006 | Kendale et al. | 101/327 |
| 7,195,733 B2 * | 3/2007 | Rogers et al. | 264/496 |
| 7,202,007 B2 * | 4/2007 | Shibata et al. | 430/199 |
| 7,296,519 B2 * | 11/2007 | Dona et al. | 101/486 |
| 7,363,854 B2 * | 4/2008 | Sewell | 101/41 |
| 7,557,367 B2 * | 7/2009 | Rogers et al. | 257/9 |
| 7,588,657 B2 * | 9/2009 | Russel et al. | 156/242 |
| 7,622,367 B1 * | 11/2009 | Nuzzo et al. | 438/472 |
| 7,682,981 B2 * | 3/2010 | Shepard | 438/713 |
| 7,802,517 B2 * | 9/2010 | Wessels et al. | 101/483 |
| 7,803,308 B2 * | 9/2010 | GanapathiSubramanian et al. | 264/334 |
| 7,968,804 B2 * | 6/2011 | Frey et al. | 174/392 |
| 8,557,351 B2 * | 10/2013 | Xu | 427/553 |
| 2003/0057601 A1 * | 3/2003 | Reitz et al. | 264/239 |
| 2004/0231781 A1 * | 11/2004 | Bao et al. | 156/230 |
| 2005/0045269 A1 | 3/2005 | Tateishi | |
| 2005/0163932 A1 | 7/2005 | Zschieschang et al. | |
| 2006/0196377 A1 * | 9/2006 | Loopstra et al. | 101/483 |
| 2007/0056680 A1 * | 3/2007 | Tan et al. | 156/232 |
| 2007/0145632 A1 * | 6/2007 | Peeters et al. | 264/219 |
| 2007/0184198 A1 * | 8/2007 | Li et al. | 427/372.2 |
| 2008/0047930 A1 * | 2/2008 | Blanchet et al. | 216/41 |
| 2008/0055581 A1 * | 3/2008 | Rogers et al. | 355/95 |
| 2008/0083484 A1 * | 4/2008 | Blanchet et al. | 156/234 |
| 2009/0199960 A1 * | 8/2009 | Nuzzo et al. | 156/230 |

FOREIGN PATENT DOCUMENTS

| | | |
|---|---|---|
| WO | WO2004107403 | 12/2004 |
| WO | 2008042079 | 4/2008 |

OTHER PUBLICATIONS

Tan, L. Kong, Y.P.; Bao, L-R; Huang, X.D.; Guo, L.J.; Pang, S.W.; Yee, A.F.: Imprinting polymer film on patterned substrates: Journal of Vacuum Science and Technology B, vol. 21, No. 6, Dec. 5, 2003, pp. 2742-2748, XP002484902. p. 2743, col. 2; p. 2746, col. 1; figure 1.

Kong, Y.P. et al: Stacked polymer patterns imprinted using a soft inkpad: Journal of Vacuum Science and Technology: Part A, AVS AIP, Melville, NY, US, vol. 22, No. 4, Jul. 1, 2004, pp. 1873-1878, XP012073830. ISSN: 0734-2101, p. 1874, col. 1, lines 42-44; figure 1.

* cited by examiner

METHOD OF DEPOSITING ORGANIC LAYERS ONTO A SUBSTRATE

BACKGROUND OF THE INVENTION

1. Field of the Invention

The present invention relates generally to the problem of the controlled deposition of organic layers onto substrates, and more particularly to the production of spatially patterned layers and multilayers for organic electronic devices and other applications, as well as devices produced by use of such methods.

The field of organic semiconductor optoelectronics is attracting increasing attention for many application sectors including displays, lighting, electronics, photodetection, solar energy conversion, and communications. These and other potential application areas require the ability to fabricate devices such as light emitting diodes, solar cells, photodiodes, transistors, optical amplifiers, and lasers. A strong attraction lies in the potential to form physically flexible, plastic devices. In all cases a low cost, reliable fabrication method is required for these devices to be able to compete with the entrenched silicon and other inorganic semiconductor device technologies. The ideal organic layer deposition technique should include the following: compatibility with high throughput (e.g. reel to reel) processing; the ability to create multilayer and multi-element structures; and compatibility with atmospheric processing conditions (i.e. not requiring costly vacuum environments). The manufacture of high quality devices also requires deposition techniques that can produce uniform, substantially defect-free layers of micron and sub-micron thicknesses and control their location on the substrate with high spatial resolution.

Organic semiconductors can be classified as small molecules, dendrimers, or polymers. Small molecules have a small number of atoms and a precise chemical structure and are often difficult to process from solution to form uniform thin films. Typical examples include N,N'-diphenyl-N,N-bis (3-methylphenyl)1-1'-biphenyl-4,4'-diamine (TPD) and 8-tris-hydroxyquinoline aluminum ($Alq_3$). They are generally processed via traditional vacuum deposition techniques. Polymers on the other hand have a large number of atoms typically arranged with a repeating chain-like structure and with a dispersity in chain lengths (and hence molecular weights) within a given sample that equates with an imprecision in chemical structure. They are typically readily processed from solution or in the melt. Examples including poly (9,9-dioctylfluorene) (PFO) and poly(3-hexyl thiophene) (P3HT). Solution processing has been widely adopted for polymer device fabrication, including spin-coating, blade-coating, ink jet printing, and gravure printing. The third class, namely dendrimers, has the chemical precision of small molecules (precise molecular weight) but can be readily soluble and have substantially higher molecular weight. They have an architecture comprising a core from which a series of branches (dendrons) emanate. Solution processing is also viable with dendrimers.

In the fabrication of organic devices additional layers may also be needed including for example conducting layers for electrodes, insulating dielectric layers, light control layers, and so on. The invention described herein equally addresses the deposition of semiconducting, conducting, insulating, and otherwise functional organic layers.

As already noted, many solution deposition techniques have been developed for use with organic materials, including inkjet printing, doctor blade coating, and gravure printing techniques for multicolor light emitting diode and polymer transistor fabrication. However, these solution-based techniques are largely unsuitable for multilayer deposition since the solvent used for one layer can often also dissolve or partially dissolve, swell, or otherwise disrupt previously deposited layers. Finding so-called orthogonal solvents (orthogonal solvents are solvents that behave as good solvents for the layer to be deposited but that do not dissolve or unfavorably swell or disrupt the underlying layers) for the organic materials to be deposited and/or re-designing the materials specifically to enable the use of orthogonal solvents is at best time consuming and at worst impossible. Using "precursor routes" to form layers of insoluble organics has also not proven especially useful, due to the difficulty of achieving full conversion from the precursor and avoiding unwanted side reactions during the thermal/photo conversion process. High temperatures and/or acidic environments incompatible with the manufacture of certain devices may be needed to approach full conversion for example of sulphonium precursors to polyphenylenevinylene derivatives. Another issue for solution processing concerns the need to spatially define the location at which a particular material is to be deposited. The substrate may need to be pre-structured using lithography or focused beam etching to define areas into/onto which the material can be selectively deposited. This adds complexity and cost.

Organic Vapor Phase deposition can be used for deposition of multiple layers of high quality but is essentially limited to small molecules and conventionally requires a vacuum environment that is problematic for high throughput manufacture. Thermal transfer and laser assisted thermal deposition are also under development as means to deposit patterned organic film structures, but they generally require the development of specifically modified materials rather than being straightforwardly compatible with existing organic semiconductors.

Micro-molding-transfer (µMT) and micro contact printing (µCP) techniques have also attracted considerable attention for use in depositing organic layers. Both techniques conventionally use a polydimethylsiloxane (PDMS) elastomer stamp as a carrier for the material to be deposited. In µMT a liquid precursor fills a micro channel patterned in the surface of a PDMS block. The precursor is then partially cured and subsequently brought into contact with the substrate. The partially cured film attaches onto the substrate and the flexible mold is removed leaving the film behind. This technique has been used to produce multilayer 3D microfluidic structures and polymer based lightwave integrated circuits from optical (non-conjugated) polymers. However, this technique involves a chemical curing process that is not available for most existing organic materials of interest, and the thickness of the films produced is typically in the micron range, which is too large for the requirement of many electronics applications. The morphology of the resulting layer is also often non-ideal due to a lack of control over the curing process. This in turn results in the formation of non-uniform structures that are undesirable within the context of a device fabrication process.

In contrast to µMT, the µCP technique transfers material to a substrate through contact with the protruding surface of a PDMS stamp. The µCP technique has been used to transfer self assembled molecules (e.g. thiols) to metal substrates to act as resists for lithography, to transfer proteins to biochips, and to transfer water soluble conducting polymers such as Poly(3,4-ethylenedioxythiophene):Poly(styrenesulfonate) (hereafter PEDOT:PSS) to device substrates. The potential to transfer a thin uniform layer of a functional polymer is an important advantage of µCP over µMT. However, this method has been developed for water-soluble materials while many of the organic materials of interest require the use of organic solvents rather than water.

The PDMS stamp is key to micro contact printing techniques. First, the PDMS stamp at room temperature is sufficiently soft that it is easy to achieve conformal contact between the stamp and a substrate, a situation that promotes transfer. Second, its surface is hydrophobic, but can be converted temporarily into a hydrophilic surface after oxygen or air plasma treatment, due to the formation of a very thin (about 2 nm), rigid $SiO_x$ layer on the surface of the stamp. This very thin layer is, however, not stable, and the surface reverts to its hydrophobic form over time. A film deposited on the surface of the PDMS stamp therefore gradually reduces its adhesion to the stamp.

Theoretically, any type of film deposited on a PDMS stamp can be transferred to any substrate using µCP, but in practice this is not the case. In order to successfully (uniformly) transfer the film from a PDMS stamp to the substrate, conformal contact with good adhesion has to be established between the film and the substrate. For example van der Waals forces between a gold film on the stamp and gold on the substrate, or static electric forces between a biomolecule on a stamp and its antibody on the substrate, very much help to promote successful transfer.

PEDOT:PSS, a water-soluble polymer, is one of the very few polymers that has been efficiently transferred to a substrate using µCP. A water rich environment helps the PEDOT:PSS to swell and deform, and helps the formation of static electric and van der Waals forces between the PEDOT:PSS and the substrate during the conformal contact stage. The µCP of typical non-water soluble polymer semiconductors using a PDMS stamp to transfer them to a substrate is in contrast difficult, since the polymer chains are relatively rigid and stiff, adversely affecting conformal contact and adhesion. Furthermore, conventional µCP usually produces an inverted U or an M cross-section for the deposited layer element due to the non-uniform film that forms when the stamp is coated with polymer solution.

The layer thickness, uniformity and quality (especially with respect to an absence of pinholes and voids) are essential parameters for devices containing functional organic films, such as light emitting diodes, photodiodes, and transistors. Very thin, uniform, and high quality films are essential for organic electronics in order to ensure the best optoelectronics performance and durability and it is for this reason that µCP has not been widely adopted as a preferred manufacturing technique.

SUMMARY OF THE INVENTION

The present invention seeks to address the many problems outlined above that are faced in providing a processing method for organic semiconductor devices that can allow straightforward fabrication of spatially patterned and multi-layer structures of the commonly used solution processable materials. A novel stamp based printing technique that can be used with both water- and organic-solvent soluble material is presented and is demonstrated to possess a number of clear advantages relative to the current approaches to organic semiconductor device fabrication.

According to the first aspect of the present invention, there is provided a method for depositing one or more organic layers onto a substrate, which comprises transferring the said layer or layers from a depositing surface of a stamp to the substrate by bringing the layer coated depositing surface of the stamp into contact with the substrate, and the use of either or both of the steps of: (i) contacting the one or more organic layer with a plasticizer; and (ii) heating the substrate and/or stamp, in order to create favorable conditions for conformal contact and uniform layer transfer. The transfer of a wide range of organic layers, in the solid state, to a wide variety of substrates, is thereby enabled. It will also be clear to one skilled in the art that, once known, this method can be suitably applied to other solution processed organic semiconductors, including, for example, dendrimers. In the following discussion polymer examples will be explicitly mentioned but the same opportunities hold also for dendrimers and other solution processable organics and are implicitly encompassed by the present invention. Thus, the use of the term "polymer" in this specification (including in the detailed description of exemplary embodiments which follows this summary of the invention) as a shorthand way of describing the one or more organic layers should not be taken too limit the materials of such organic layers, which include, but are not limited to, polymer materials.

The method of the present invention specifically introduces the use of plasticizers and the use of heat applied to the structure during production to assist the printing of functional polymer layers. Polymers may become softer and easier to deform when the temperature is raised towards or beyond their glass transition temperature, or a plasticizer is added, or both. The use of a plasticizer is particularly helpful when polymer films need to be deposited on a stiff substrate such as glass. In the present invention, the films are deposited in the solid state. The method can therefore be readily used to deposit multilayer structures incorporating stacks of one or more solution processable materials without the need for orthogonal solvents. This facilitates the creation of devices with multilayer architectures that achieve superior performance without the need to modify any of the materials selected for incorporation therein.

The layers produced by the technique are of appropriately high quality, so that the method can be used in the effective production of organic semiconductor devices. The technique allows smooth, uniform films of thicknesses from a few tens of nanometers to a few hundred nanometers to be deposited. Thicker films are then possible via multiple printing steps. Lateral resolutions in the sub µm range can be achieved. The technique is also suitable for integration with high throughput (e.g. reel to reel) processing. The technique according to the invention thus makes it possible to prepare multilayer organic electronic device structures and other structures, and to optimize their function.

A second aspect of the invention is the use of the method of depositing a polymer described above to transfer patterned polymer layers onto a substrate. While it may be possible to achieve this at some level by depositing polymer onto a PDMS stamp having protrusions structured to reproduce the desired pattern, the subsequent deposition from the stamp tends to be non-uniform and hence of poor quality. In particular, there may be significant geometric non-uniformities around the edges of the deposited patterned polymer layer. Such geometric non-uniformity is undesirable within a device fabrication process since it may result in non-uniform electrical and/or optical performance.

According to this aspect of the invention, a polymer layer may be pre-patterned on a flat stamp surface, by bringing the depositing surface of the stamp into conformal contact with a patterned substrate and the use of either or both of the steps of contacting the polymer with a plasticizer and heating the substrate, whereby part of the polymer layer on the stamp is deposited onto the patterned substrate. The polymer remaining on the stamp (after the transfer of polymer from the depositing surface of the stamp to the patterned substrate) may then be deposited onto another substrate, resulting in a high quality patterned polymer layer. No pre-patterning of the final substrate or post-deposition patterning of the final layer is required. Patterned polymer layers can, for instance, then be sequentially printed to produce device arrays.

The polymer or indeed a blend of two or more polymers or one or more polymers and one or more molecules or one or more polymers and one or more nanoparticles, colloids, flakes, or other fillers deposited by the method according to the invention may comprise one or more of any conducting, semi-conducting or insulating polymer, including PEDOT: PSS, P3HT, PFO, F8BT, other polyfluorene, polyarylene, polyarylenevinylene, polysilane, polyvinyl alcohol, polyamic acid, polyimide, polymethylmethacrylate, etc., where P3HT is poly-3-hexylthiophene, PFO is poly(9,9-dioctylfluorene) and F8BT is poly(9,9-dioctylfluorene-co-benzothiadiazole).

Preferably the depositing surface of the stamp is an elastomeric material, more preferably PDMS. The polymer layers can be applied to the stamp by spin coating, dip coating, spray coating, or other techniques. The quality of the application technique will determine the quality of the polymer layer on the stamp and thus the quality of the final deposited layer.

The layer transfer may be onto any solid-state substrate. Examples include: bare or coated ceramic, metal, glass, and polymer substrates. Substrates may be pre-coated with a film of an inorganic material such as ITO (indium tin oxide), or an organic film such as PEDOT:PSS.

When required, the plasticizer is blended into the polymer before the deposition of the polymer. Alternatively, the plasticizer is deposited on the surface of the polymer layer on the stamp or on the surface of the substrate before transfer of the polymer to the substrate. In all cases the plasticizer acts to plasticize the polymer when the stamp is brought into contact with the substrate.

Any plasticizer may be used so long as it increases the softness or pliability of the polymer to be deposited and doesn't adversely affect the device function of the polymer layer. Suitable plasticizers typically have relatively small molecular weight and a high boiling point. Preferably, the plasticizer is glycerol, since this is widely available and suitable for use with a range of polymers. The plasticizer may, if needed, be applied to the substrate in a thin film format by spin-coating or another method.

Preferably, the step of heating the substrate comprises heating to a temperature close to the glass transition temperature of the polymer during the deposition process. For P3HT, for example, the glass transition temperature is approximately 140° C. and the preferred heating temperature for transfer of a P3HT layer is within 40° C. of the glass transition temperature. However, some polymers have high glass transition temperatures of 350-° C. to 400-° C., and, for these polymers, heat-assisted layer transfer preferably involves heating to within no more than 150° C. of the glass transition temperature of the polymer. More preferably it involves the use of a plasticizer to lower the glass transition temperature.

Preferably, if a heating step is used, the substrate will be heated during the deposition process, while the stamp is in contact with the substrate. The heating step may last for several seconds or several minutes, depending on the heating temperature and material being heated. Preferably, heat is applied for between 1 and 300 seconds, more preferably between 10 and 180 seconds, 20 and 120 seconds, or 30- and 50 seconds. An optical heating method might be expected to prove beneficial for high-throughput implementation.

According to the invention, there are provided electronic or optoelectronic or photonic devices having one or more polymer layers upon a surface, wherein at least one layer is deposited using the method according to the invention. Such devices include liquid crystal display devices, organic light emitting devices, organic photovoltaic devices, organic photodetectors, organic transistors, and organic photonic devices (including lasers, amplifiers, switches, and the like).

DESCRIPTION OF THE DRAWINGS

The invention may be put into practice in a number of ways and a number of embodiments are shown below by way of example with reference to the following figures, in which.

DETAILED DESCRIPTION OF EXEMPLARY EMBODIMENTS

Figure 1:
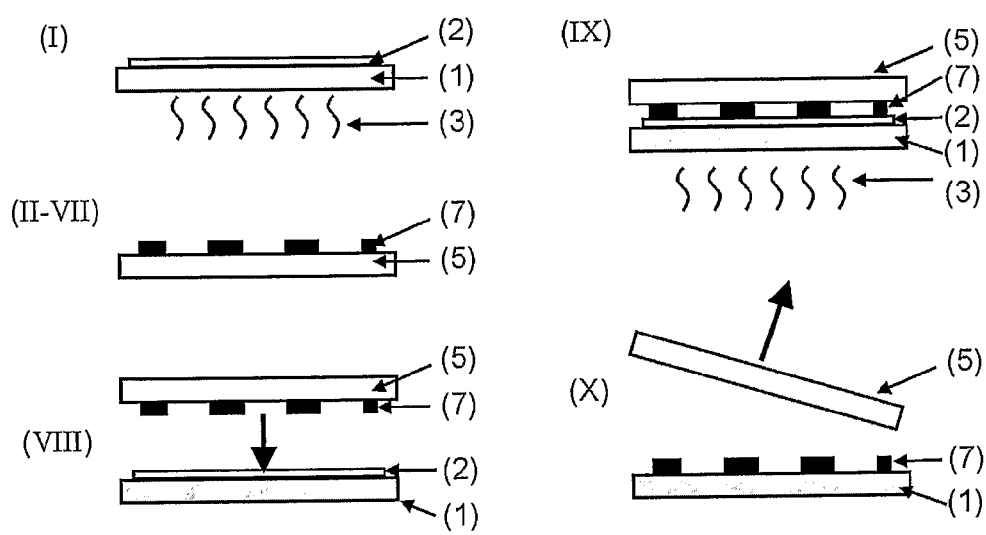
FIG. 1 describes the heat and/or plasticizer assisted deposition method, wherein: Step (I) describes the deposition of plasticizer (2) onto a substrate (1), as required, for example if that substrate has a hard inorganic surface, and heating (3) to remove any solvent used in the plasticizer deposition; Steps (II-VII) of FIG. 1 relate to the optional process of patterning the layer to be deposited and are described below in FIG. 2; Step (VIII) describes the contacting of the elastomeric stamp (5) carrying a patterned (or alternatively uniform (not shown herein)) polymer layer (7) with the substrate (1); Step (IX) describes heating of the contacted layers; and Step (X) describes the removal of the elastomeric stamp (5) and the transfer of the patterned polymer (7) to the substrate (1)

More details are now given of the method of the current invention as illustrated in the figures. In FIG. 1, Step (I) involves the deposition of a plasticizer (2) onto a substrate (1). This is most often required for substrates that are hard, such as ITO, glass, or metal. If the substrate (1) surface is soft, for example when there is a previously deposited polymer layer on the substrate (1), then this Step (I) may not be required. There are a plurality of plasticizers available, including glycerol. The plasticizer (2) deposition may be achieved via a plurality of methods including blade-coating, spin coating, dip-coating, inkjet printing, and other methods. Subsequent heating (3) is then applied to remove any solvent from the plasticizer (2) film, if deposited using a solution deposition method. The temperature of such heating (3) must be sufficient to remove the solvent, but not so high as to damage the plasticizer (2) or reduce the uniformity of its coverage.

Figure 2:
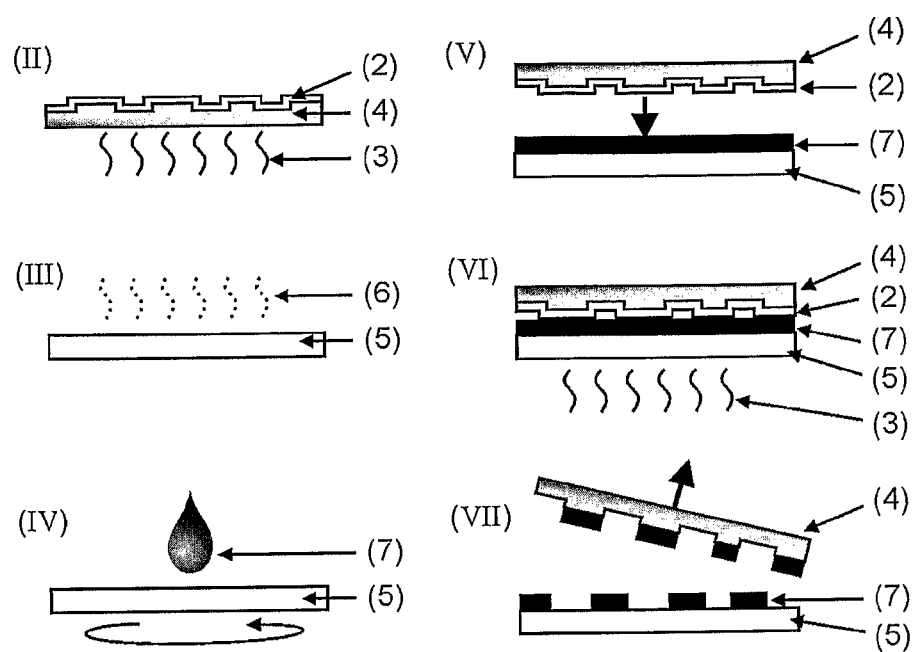
FIG. 2 describes a method to pattern a polymer layer on an elastomeric stamp as indicated in the caption to FIG. 1, wherein: Step (II) describes the deposition of a plasticizer (2) onto a negative patterned (with a relief pattern corresponding to the negative of the desired pattern) substrate (4), and subsequent heating (3); Step (III) describes the preparation of the elastomeric stamp (5) for spin coating via plasma or oxidative treatment (6); Step (IV) describes the deposition of the polymer layer (7) onto the elastomeric stamp (5), shown as being via spin coating, though other deposition methods would also be suitable; Step (V) describes the contacting of the elastomeric stamp (5) coated with polymer layer (7) and the negative patterned substrate (4) coated with plasticizer layer (2); (VI) describes subsequent heating to allow transfer of the polymer areas in contact with the negative patterned substrate (4); and Step (VII) describes the transfer of sections of the polymer film to the said negative patterned substrate, leaving a high quality film on the elastomeric stamp (5) with the desired spatial pattern.

As an alternative to the approach described in FIGS. 1 and 2, the plasticizer (2) may be directly incorporated within the polymer solution and co-deposited to form a polymer/plasticizer blend layer. Step (I) is then no longer required, and Steps (II)-(X) are carried on as before, but without a separate plasticizer layer (2) and a polymer layer (7) with the layer (7) instead comprising the polymer/plasticizer mixture.

Steps (II)-(VII) of FIG. 2 deal with the optional patterning of the polymer layer (7) on the elastomeric stamp (5). This will be dealt with in more detail below, but can be summarized as a process sequence that allows the formation of a high-quality patterned polymer layer (7) on an elastomeric stamp (5). This polymer layer (7) can be of a plurality of polymers and polymers blended with molecular materials and or nanoparticles/colloids/flakes or other fillers, whether soluble in water, or in organic solvents. Specific examples include water soluble PEDOT:PSS, thiophene derivatives such as P3HT, fluorene polymers such as F8BT, polyarylenes, polyarylenevinylenes, non-conductive (insulating) polymers such as polyvinylphenol, optical polymers such as polymethylmethacrylate, photoresists, and polymer blends such as P3HT blended with PCBM.

Step (VIII) deals with the contacting of the said substrate (1) and the stamp (5). In this case, these two components are brought into surface contact with each other. This may be achieved via a plurality of methods, including those compatible with large area, high throughput processing, using flat stamps or rollers. The area of printed polymer is determined by the stamp size. For printing relatively large areas, the thickness of the stamp (5) may be increased or alternatively a backplane may be applied to maintain uniformity. The backplane may be formed from any suitably stiff material, for example plastic, metal, or glass. The stamp (5) may be increased in area or shaped appropriately for the desired level of processing throughput and for fabrication on structures with non-flat surfaces.

Step (IX) aids the transfer of the polymer layer (7) to the substrate (1) by subsequent heating (3). In addition, the plasticizer layer (2) described in Step (I) will perform its active role in this Step (IX). As described earlier, during this Step (IX) the surface character of the elastomeric stamp (5) alters such that it becomes less adhesive to the polymer layer (7). At the same time, heating the polymer layer (7) to a temperature close to its glass transition temperature will allow increased chain mobility and promote transfer to the more adhesive substrate. The plasticizer (2) also assists this process.

Ideal transfer is achieved when heating (3) brings the polymer layer (7) close to its glass transition temperature. For example the glass transition temperature of P3HT is approximately 140° C. and efficient transfer is achieved at 130° C. The heating time depends on the thickness of the film and is generally optimal between 30 and 50 seconds for the 100 nm films typically used in organic semiconductor devices. Thicker films will typically require a longer heating time.

Step (X) describes the removal of the stamp (5) to leave the polymer layer (7) attached to the elastomeric substrate (1). The stamp (5) may be removed by lifting at a plurality of angles relative to the substrate (1), and may be determined by the structure of the deposition apparatus.

The steps in FIG. 2 describing patterning of the polymer layer (7) on the elastomeric stamp (5) are as follows:

Step (II) describes the deposition of a plasticizer (2) onto a stamp (4) with a relief pattern corresponding to the negative of the desired polymer layer (7) pattern. The negative stamp (4) can be formed of a material such as silicon, silicon dioxide, metal, or a polymer such as SU-8. The deposition methods and subsequent heating (3) are as described above for Step I. The plasticizer (2), again as described above, may alternatively be added to the polymer solution (7) in Step (IV).

Step (III) describes the preparation of the elastomeric stamp (5) for the polymer layer (7) deposition. The elastomeric stamp (5) may be formed from a plurality of elastomeric polymers but most typically PDMS. The surface morphology of the elastomeric stamp (5) will be a determining factor in the quality of the final device, thus its surface flatness is important. The final step in the preparation of PDMS is a surface modification via a plurality of techniques, but most typically via air or oxygen plasma treatment (6). This modification renders the surface suitable for the subsequent polymer layer (7) deposition step.

Step (IV) describes the deposition of the polymer layer (7) onto the stamp (5) prepared as described in Step (III). As noted above, in summarizing Steps (II)-(VII), the polymer layer (7) may comprise water and organic solvent soluble polymers, and soluble polymers blended with molecules and nanoparticles, colloids, flakes and other fillers. In addition, the polymer layer (7) may also incorporate a plasticizer. Deposition can be via a plurality of methods including spin coating, inkjet printing, and dip-coating.

Step (V) describes the contacting of the negative patterned substrate (4) (with or without the plasticizer (2) deposited as described in Step (II)) and the stamp (5) with the polymer layer (7) (prepared as described in Steps (III) and (IV)). The contacting requires surface contact of the two layers and can be performed using a plurality of techniques including those compatible with high throughput fabrication.

Step (VI) describes subsequent heating (3) that aids the transfer of sections of the polymer layer (7) to the negative patterned substrate (4). As described in Step (IX) above, this preferably involves heating the polymer layer (7) close to its glass transition temperature. The plasticizer (2) plays its active role here, as previously described in Step (II).

Step (VII) describes the removal of the negative patterned substrate (4), on which is now deposited those sections of the polymer layer (7) that needed to be removed to form the desired pattern. The stamp (5) is then left with a high quality polymer layer (7) patterned with the desired pattern, which can be deposited onto any required substrate as described in FIG. 1 Steps (VIII)-(X).

Particular advantages over previous deposition techniques offered by the method of the present invention include: the ability to print polymers which require an organic solvent as well as those which require a water solvent; the ability to print spatially patterned layers as required in many device formats; the ability to print multiple high-quality layers with well defined interfaces between layers and with no degradation of previously deposited layers during the deposition of a subsequent layer; and the ability to deposit multiple uniform layers of defined thickness. Thus, the method of the present invention is capable of creating novel devices with superior architectures and consequent superior performance (see examples below). Furthermore, the method of the present invention is expected to be compatible with high throughput (e.g. reel to reel) processing and with deposition onto curved as well as flat substrates.

EXAMPLES

By way of illustration, examples of how the invention may be put into practice are now described in detail. In the first example, a patterned polymer film is deposited on a glass substrate. In the second example, multilayer photodiode devices are fabricated, showing that the method according to this invention allows novel device architectures and may be used to achieve high quality devices with superior performance.

The polymers used in these examples were: poly(3,4-ethylenedioxythiophene):poly(styrenesulfonate) (PEDOT:PSS) from H. C. Stark; regioregular poly(3-hexylthiophene) (P3HT) from American Dye Source Inc.; poly(9,9-dioctylfluorene-co-benzothiadiazole) (F8BT) from The Dow Chemical Company; [6,6]-phenyl C61-butyric acid methyl ester (PCBM); and glycerol from Sigma-Aldrich. The solvent used to dissolve P3HT, PCBM, and F8BT was chlorobenzene (CB). The CB solution concentrations used to deposit films were 20 mg ml$^{-1}$ for P3HT, 30 mg PCBM plus 30 mg P3HT per ml for the P3HT:PCBM blend, and 20 mg F8BT plus 20 mg PCBM per ml for the F8BT:PCBM blend. Glycerol was used as a plasticizer for the polymer films: A glycerol concentration of 500 mg ml$^{-1}$ in water or isopropanol solution was used for spin coating.

The PDMS stamps were prepared by casting a mixture of SYLGARD 184 silicone elastomer (SYLGARD is a registered trademark of Dow Corning) and a curing agent (10:1 ratio SYLGARD:curing agent by mass). The two components were stirred thoroughly in a beaker for thirty minutes and degassed in vacuo for an hour before being gently poured onto the surface to be replicated.

For a flat surface stamp, the mixture was poured onto a 50 nm thickness Au-coated Si wafer, and cured at 70° C in an oven overnight. The PDMS stamps were peeled away from the Au-coated silicon wafer after cooling, placed on a glass surface, and then cut into pieces (1.2 cm×1.2 cm squares). The thickness of the PDMS was typically 2 to 4 mm. The resulting PDMS stamp structures were lifted with tweezers, attached to glass backplanes, and placed within a plasma asher (EMITECH K1050X) for plasma treatment.

The power was set to 30 W for 30 s and the working gas was air at 0.2 mbar pressure.

The glass substrates and ITO coated glass substrates used in our examples were ultrasonic bath cleaned (30 minutes) using deionized (DI) water mixed with 20% DECON 90 (DECON is a registered trademark of Decon Laboratories Limited Company), subsequently rinsed three times with DI water, and ultrasonic bath cleaned again in pure DI water (30 minutes). They were finally dried using a high-pressure airline.

The thickness of the samples was characterized using an Alpha Step 2000 surface profilemeter. Optical images were recorded using a Zeiss Axioskop microscope equipped with a Kodak DC290 Zoom digital camera. A Digital Instruments DI3100 atomic force microscopy (AFM) was employed to study film surface topography in tapping mode.

Example 1

Figure 3:
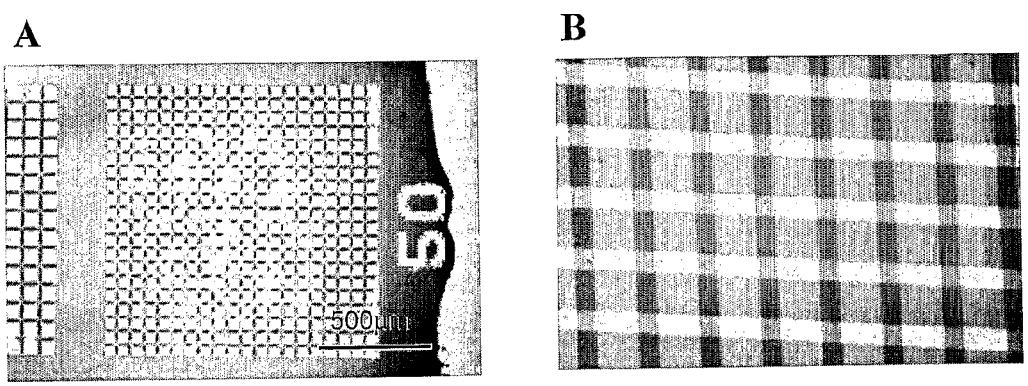
FIG. 3 displays two optical images of structures fabricated by the method of the invention:
(i) a patterned P3HT:PCBM blend layer printed onto a glass substrate, where PCBM is the soluble fullerene 1-(3-methoxy carbonyl)-propyl-1-phenyl-(6,6)-$C_{61}$; and
(ii) overlapped stripe patterned P3HT layers sequentially printed on a glass substrate at right angles to produce a grid pattern.
Figure 5:
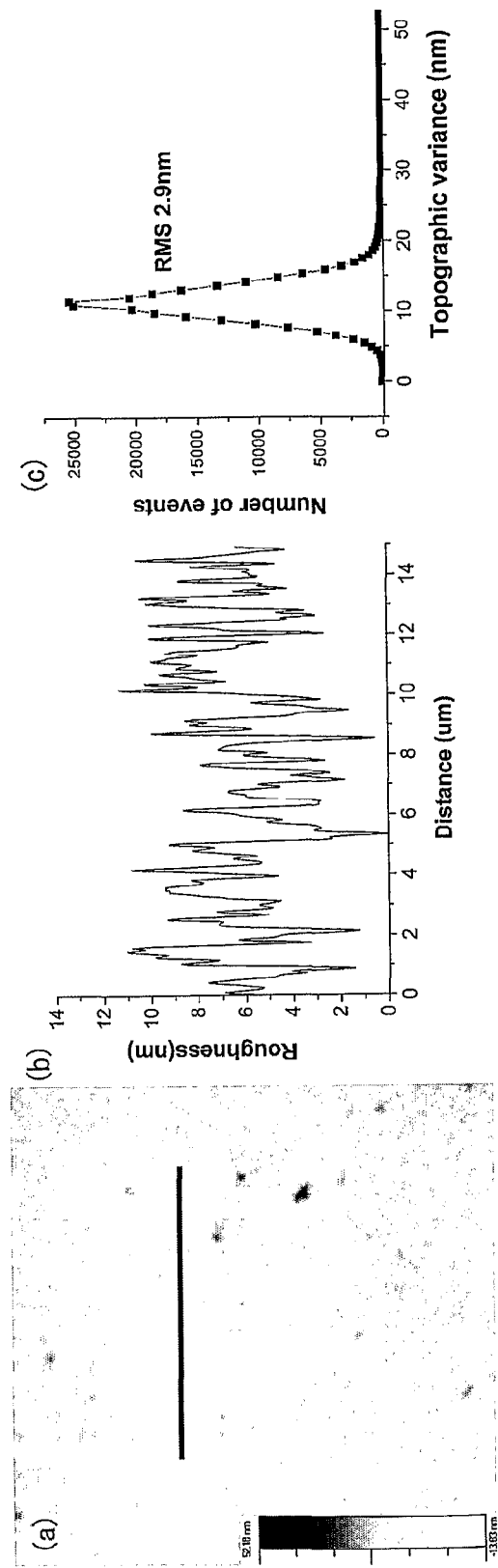
FIG. 5 shows Atomic Force Microscopy (AFM) data for a printed layer:
 (a) the AFM measured surface topography of a P3HT: PCBM blend layer printed on top of a P3HT/PEDOT: PSS/ITO coated substrate;
 (b) the surface roughness in cross-section of the P3HT: PCBM blend layer measured along the line marked in (a); and (c) the spatially resolved surface height distribution showing a root mean square variance of only 2.9 nm.

The first example describes the deposition of polymer layers of high quality and includes both uniform and patterned layers and multilayers (see FIGS. 3 and 5). A detailed description of fabrication steps is given for the deposition of regioregular poly-3-hexylthiophene (P3HT), but the deposition method is equally applicable to all soluble polymers as described previously and illustrated below.

Step 1: A thin glycerol film was spin coated on one surface of the cleaned glass substrate from water solution (500 mg/ml) at a spin speed of 1500 rpm (30 s spin duration). The coated glass substrate was then heated on a hot plate in air at 140° C. for 30 s.

Step 2: A 35 nm thickness uniform layer of P3HT was deposited on the plasma treated surface of a PDMS stamp, via spin-coating from chlorobenzene solution (20 mg/ml) at 5000 rpm (30 s duration). The stamp was then brought into conformal contact with the surface of the glass substrate to which the glycerol plasticizer had previously been applied.

Step 3: The substrate and stamp were heated on a hot plate in air at 120-140° C. for 30-50 s.

Step 4: The PDMS stamp was removed from the glass substrate to leave the polymer film attached thereto.

The use of this method resulted in the deposition of a high quality uniform (un-patterned) 35 nm thickness polymer layer on the substrate. The same Steps 2-4 may be repeated to produce a multi-layered sample either allowing thick film deposition of a single material or, of more relevance for devices, a heterostructure comprising two or more different materials.

In order to achieve a patterned polymer layer, a negatively patterned (i.e. with a pattern representing the negative of the desired pattern) SU-8 structure was used to pattern the polymer on the PDMS stamp before it was transferred to the substrate.

The patterned SU-8 structure was prepared according to the manufacturer's (MicroChem Corporation) standard guidelines. A 4 inch diameter silicon wafer was cleaned using "piranha" solution ($H_2O:NH_4O:H_2O_2$=5:1:1) at 80° C. and rinsed in DI water before being dried under $N_2$ gas flow. A 14 μm thickness SU-8 10 film was spincoated at 3000 rpm (15 s duration) on top of the wafer and soft-baked at 65° C. for 5 min. The pattern was then defined by expose to UV light for 12 s in a Karl Suss mask aligner using a Cr mask. The exposed wafer was subjected to a sequence of process steps: heating for 1 min at 65° C., and 2 min at 95° C., followed by a 2 min immersion in SU-8 developer, and finally a full cure in an oven at 200° C. in air.

Five additional steps (beyond those needed to prepare a uniform film) are used in preparing the patterned polymer film on a glass substrate:

Step 1: The patterned SU-8 structure was coated with glycerol by spin coating from water solution (3.3% glycerol) at 1500 rpm (30 s duration). The glycerol coated patterned SU-8 structure was then heated on a hot plate in air at 140° C. for 30 s. Before glycerol coating, the SU-8 substrate may optionally be treated with air plasma (EMITECH K1050X), for example at 30 W for 30 s, to assist the following polymer transfer.

Step 2: The polymer layer, in this case P3HT, was deposited, as above, by spin coating from solution (20 mg/ml in chlorobenzene) at 5000 rpm (30 s duration) onto a flat PDMS stamp which had been treated by air plasma (EMITECH K1050X) at 30 W for 30 s. The polymer coated PDMS stamp was then brought into conformal contact with the negatively patterned SU-8 structure.

Step 4: The negatively patterned SU-8 structure was removed from the PDMS stamp taking the unwanted part of the uniform polymer layer with it, resulting in a polymer layer on the PDMS stamp with the desired pattern.

Step 5: The patterned polymer layer was then ready to be transferred to a substrate using the steps described above for the uniform P3HT layer.

The use of this method results in the deposition of a high quality patterned polymer layer on the substrate. As before, the process may be repeated to produce a multilayered sample either allowing the building up of a thicker layer of a single material or a heterostructure comprising two or more different materials. Furthermore, a variety of different patterned and uniform layers can be deposited in sequence. The polymer or indeed a blend of two or more polymers or one or more polymers and one or more molecules or one or more polymers and one or more nanoparticles, colloids, flakes or other fillers may comprise one or more of any conducting, semi-conducting, or insulating polymer, including PEDOT:PSS, P3HT, PFO, F8BT, or any other polyfluorene, polyarylene, polyarylenevinylene, polysilane, polyvinyl alcohol, polyamic acid, polyimide, polymethylmethacrylate, etc.

In addition, the orientation of the patterned layer being deposited can be selected relative to the orientation of a previously deposited layer to construct more complex architectures as desired for particular device formats.

FIG. 3 shows two optical images of patterned layers deposited using the method of the present invention on a glass substrate. FIG. 3(A) shows a P3HT:PCBM blend layer (dark) patterned in the shape of a grid on a glass (light) substrate. The exposed glass squares seen in the grid pattern are 50×50 μm in dimension, thus the patterning process is sufficient to obtain VGA resolution (640×480 pixels) on a mobile phone screen. The smallest dimensions are limited by the mask used to create the SU-8 structure, and sub-micron dimension patterns have also been prepared via this technique.

FIG. 3(B) shows two separately deposited orthogonally overlapped stripe patterned P3HT layers (dark) on a glass (light) substrate. The optical image clearly shows the fidelity of the pattern and the ability of the method of the invention to sequentially deposit high quality patterned polymer layers with selected relative orientation.

Figure 4:
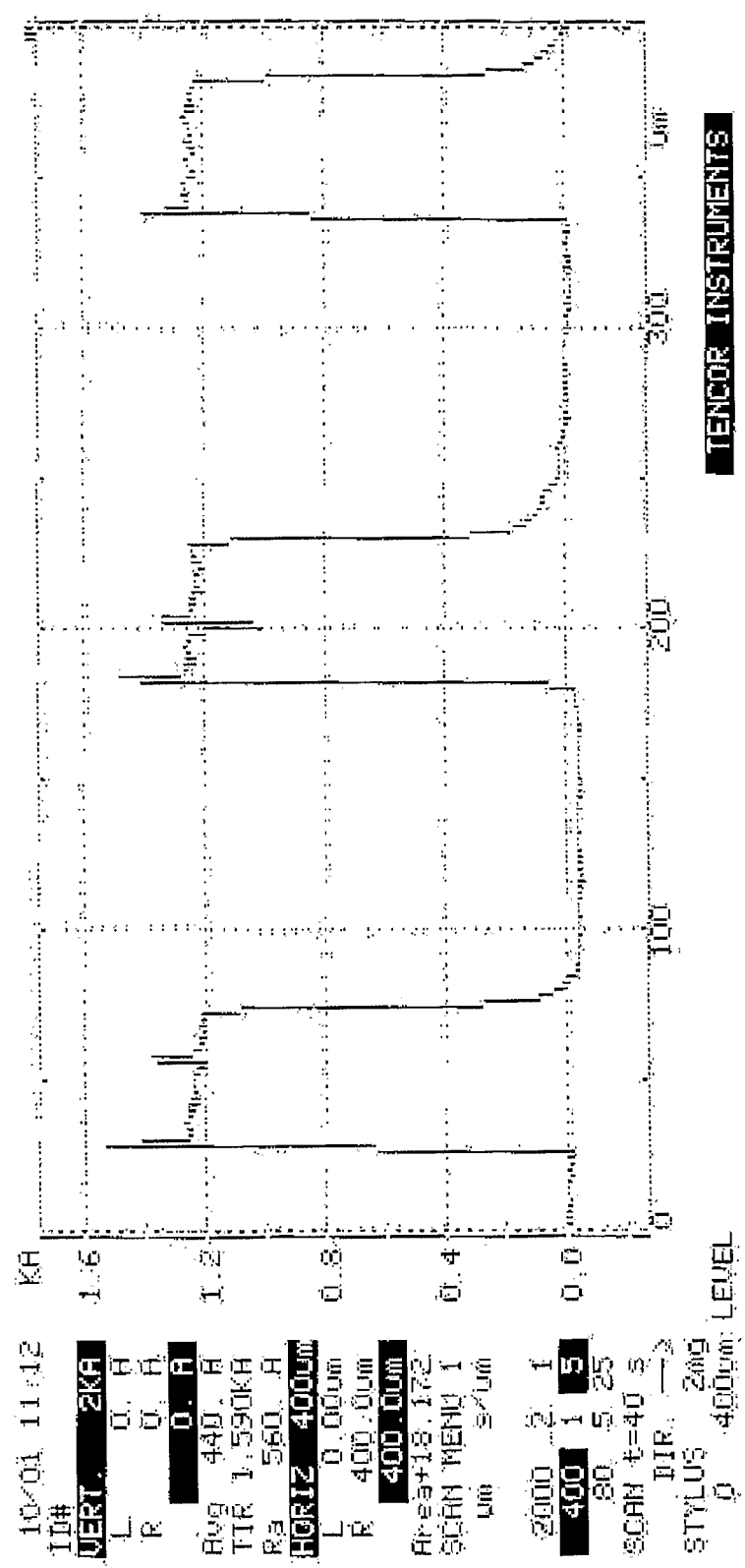
FIG. 4 is the topographic profile (measured with a Dektak profilometer) of a section of the layer imaged in FIG. 3 (1), wherein the profile demonstrates the uniform deposition of a 120 nm thickness film patterned into a grid with 50 μm wide stripes.

FIG. 4 shows the topography profile of the grid patterned P3HT:PCBM blend layer deposited on a glass substrate, measured using a surface profilometer. The sharp edges in the profile are an attractive feature of the technique.

FIG. 5($a$) shows the AFM topography, FIG. 5($b$) shows the height profile measured along the line indicated in FIG. 5($a$), and FIG. 5($c$) shows the calculated topographic variance of triple-layer structures comprising in sequence PEDOT:PSS, P3HT, and P3HT:PCBM deposited on top of an ITO coated substrate. The PEDOT:PSS, P3HT, and P3HT:PCBM layers were separately deposited in sequence by the method of the present invention. The surface of the printed films is found to be relatively smooth, with an average roughness of around 2.9 nm. This shows well the ability afforded by the method of the present invention to fabricate multilayer heterostructures of controlled layer thickness and quality. Such multilayer structures have been found to be beneficial for optimizing the performance of many polymer devices.

An important aspect of the film quality of these printed layers is that no pin-holes were visible in them. Good film quality, an advantage of the method according to the present invention, is also confirmed by the polymer devices referred to in the following examples, which have leakage currents as low as the best quality spin-coated films, and in some cases lower. The existence of pin-holes in a polymer film usually leads to poor device performance. In the case of diodes, pin-holes can allow the metal of the top contact to come closer to the metal of the base contact than intended, thus causing the device to have a higher leakage current than expected or, ultimately, to short. This is a problem for photodiode detection sensitivity, for solar cell efficiency, and for light emitting diode emission uniformity, and in all cases also results in a limiting factor in the device lifetime.

Example 2

Multilayer polymer device structures have an architecture that is sufficiently flexible to allow systematic optimization of function. For example, undesirable electron-hole recombination in single layer, blend-based photodetectors and solar cells can be addressed by vertical structuring. Creating a stack structure with a donor-acceptor blend layer sandwiched between hole and electron transport layers is effective for this. Thus, the performance of a triple-layer photodiode can be anticipated to be better than that of a single or bi-layer device, an expectation that is in agreement with the results shown below.

In this second example, photodiode/solar cell devices were prepared using the method of the present invention to deposit polymer layers onto PEDOT:PSS layers spin-coated on pre-patterned ITO coated glass substrates. The PEDOT:PSS layers were prepared by spin coating, and the P3HT, P3HT:PCBM blend and F8BT:PCBM blend layers were then deposited by the method of the present invention to fabricate double (P3HT/P3HT:PCBM) and triple (P3HT/P3HT:PCBM/F8BT:PCBM) layer stacks. Single layer reference structures were also fabricated, but in this case the P3HT:PCBM was spin coated, as typically reported in the literature, rather than printed. No plasticizer was needed in the double and triple layer stack device fabrications, since the printing was onto a polymer layer (spin coated PEDOT:PSS, printed P3HT, and in the triple layer stack also printed P3HT:PCBM) to which transfer can be more readily affected than for glass or other rigid substrates. It might of course be preferable in a manufacturing process to also print the PEDOT:PSS layer as well as the subsequent layers, and this could be done if so desired.

In summary, three types of device structure were fabricated:
Bi-Layer Diodes:
Glass/ITO/spin-coated PEDOT:PSS/printed P3HT/printed P3HT:PCBM/LiF/Al;
Triple-Layer Diodes:
Glass/ITO/spin-coated PEDOT:PSS/printed P3HT/printed P3HT:PCBM/printed F8BT:PCBM/LiF/Al; and
Single-Layer Diodes:
Glass/ITO/spin-coated PEDOT:PSS/spin-coated P3HT:PCBM/LiF/Al.

The brief preparation details are as follows:

The substrates were 1.2 cm² glass plates with an ITO conductive oxide coating of sheet resistance 25 Ω per square. PEDOT:PSS was spin-coated (3000 rpm and 60 s duration) directly thereon from a commercial aqueous solution (H. C. Starck, Baytron PE FL) and they were then heated at 150° C. for 30 min on a hot plate in air. The resulting PEDOT:PSS film thickness was 40 nm.

For the reference single-layer diodes, P3HT:PCBM (110 nm thickness) was spin-coated (1500 rpm) onto the PEDOT:PSS coated ITO substrates from a chlorobenzene blend solution (30 mg PCBM with 30 mg P3HT in one ml solvent).

The PDMS stamps were prepared and plasma treated in the same way as described in Example 1 above. P3HT layers (15 nm thickness) were deposited on PDMS stamps by spin-coating (5000 rpm) from 20 mg/ml chlorobenzene solution. P3HT:PCBM blend layers (110 nm) were deposited on PDMS stamps by spin-coating (1500 rpm) from chlorobenzene blend solutions (30 mg PCBM with 30 mg P3HT in one ml solvent). F8BT:PCBM blend layers (45 nm) were deposited on PDMS stamps by spin-coating (5000 rpm) from chlorobenzene blend solutions (20 mg F8BT with 20 mg PCBM in one ml solvent). All spin coating steps were performed in air.

These coated PDMS stamps were then used in sequence to fabricate the bi-layer and tri-layer devices. In each case the printing process (c.f. Steps 2-4 in Example 1) involved the following steps: the stamp was brought into conformal contact with the surface to be coated; the substrate and the stamp were heated on a hot plate in air at 120-140° C. for 30-50 s; and the PDMS stamp was removed to leave the polymer film attached to the surface to be coated.

The bi-layer diode was thus fabricated by first printing a 15 nm thick P3HT electron blocking layer (from a 15 nm thickness P3HT coated PDMS stamp) onto a PEDOT:PSS coated ITO substrate. Next, a 110 nm P3HT:PCBM charge photogeneration blend layer was printed onto the P3HT/PEDOT:PSS/ITO/glass substrate (from a 110 nm thickness P3HT:PCBM coated PDMS stamp).

The tri-layer diode was likewise fabricated by first printing a 15 nm P3HT electron blocking layer (from a 15 nm thickness P3HT coated PDMS stamp) onto a PEDOT:PSS coated ITO substrate. Next, a 110 nm P3HT:PCBM charge photogeneration blend layer was printed onto the P3HT/PEDOT:PSS/ITO/glass substrate (from a 110 nm thickness P3HT:PCBM coated PDMS stamp). Finally, a 45 nm F8BT:PCBM hole blocking layer was printed onto the P3HT:PCBM/P3HT/PEDOT:PSS/ITO/glass substrate (from a 45 nm thickness F8BT:PCBM coated PDMS stamp).

To complete each of the device structures, LiF (0.6 nm) and Al (50 nm) were sequentially deposited (Edwards 307A thermal evaporator at $\approx 5\times10^{-6}$ torr) to form the top electrode. A shadow mask was used to define the spatial location of each top electrode. The active area of the resulting devices was 0.15 cm×0.3 cm. After the final electrode deposition, the samples were transferred into a nitrogen atmosphere glove box, where a post-fabrication anneal was carried out on a hot plate at 140° C. for 15 min. The glove box atmosphere had an $O_2$ level of less than 0.1 ppm and a $H_2O$ level of less than 1 ppm.

AFM measurements were performed using a Dimension 3000 (Digital Instruments, Santa Barbara, Calif., USA) instrument in tapping mode. Photocurrent and I-V characteristics were measured using a Keithley 238 Source Measure Unit connected to a computer via a GPIB interface. Illumination was performed with the monochromatic (Bentham monochromator) output from a Tungsten halogen source and the polymer photodiode response was calibrated using a Newport UV-818 photodiode.

Figure 6:
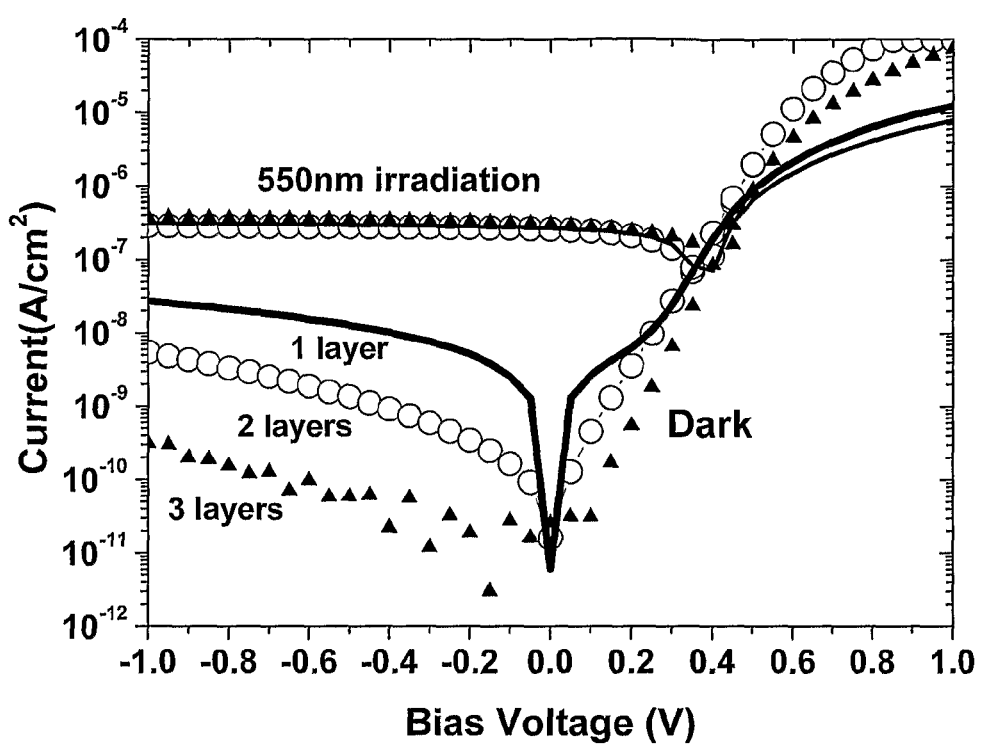
FIG. 6 presents the current density vs. voltage (J-V) characteristics for each of three photodiode structures produced by the method according to the present invention, comprising respectively structures with a single photoactive layer (P3HT), a double layer (P3HT followed by P3HT:PCBM blend), and a triple layer (P3HT followed by P3HT:PCBM followed by F8BT:PCBM)

FIG. 6 shows the dark and photocurrent data for the three different photodiode types described above. The lower three lines are the dark current results, and the upper three lines are the 550 nm irradiation photocurrent results. The solid line in both cases is for a reference single layer diode (ITO/PEDOT:PSS/P3HT:PCBM(spin-coated)/LiF/Al). The circular data points are for a bi-layer diode (ITO/PEDOT:PSS/P3HT/P3HT:PCBM/LiF/Al) and the triangular data points are for a tri-layer diode (ITO/PEDOT:PSS/P3HT/P3HT:PCBM/F8BT:PCBM/LiF/Al).

The characteristics of the three diodes are significantly different. While the short circuit current does not change dramatically, there is a one order of magnitude reduction in the dark current at −1 V and a one order of magnitude increase in the dark current at +1 V for the bi-layer diode compared to the single-layer reference diode. This suggests that the combination of the thin P3HT layer and printed P3HT:PCBM layer helps to limit shunt paths between the electrodes. Despite the thickness of the bi-layer diode being increased by adding the 15 nm thick P3HT layer, the positive injection current increases rather than decreases.

A further order of magnitude reduction in dark current is achieved for the tri-layer diode as compared to the bi-layer diode. In similar fashion to the effect of the P3HT layer as an electron blocking layer, the insertion of a F8BT:PCBM layer between the P3HT:PCBM layer and the LiF/Al electrode acts as a hole blocking barrier. Here, the role of F8BT is to act as a host in order to promote a uniform F8BT:PCBM film deposition. It is known that the electron mobility is an order of magnitude higher than the hole mobility in PCBM, and that the hole barrier between P3HT and PCBM is as much as 0.9 eV. Another benefit of inserting the F8BT:PCBM layer is that the open circuit voltage slightly increases for the tri-layer diode (from 0.35 V to 0.40 V).

The multilayer devices have increased photosensitivity (beneficial for photodetectors) and improved output impedance (beneficial for solar cells). The rectification ratios for diodes based on single-, bi-, and tri-layer structures also clearly show that the multilayer constructions have enhanced diode performance. Rectification ratios of $4\times10^2$, $1.4\times10^4$, and $1.4\times10^5$ for the single-, bi-, and tri-layer diodes, respectively, at ±1 V have been found.

Figure 7:
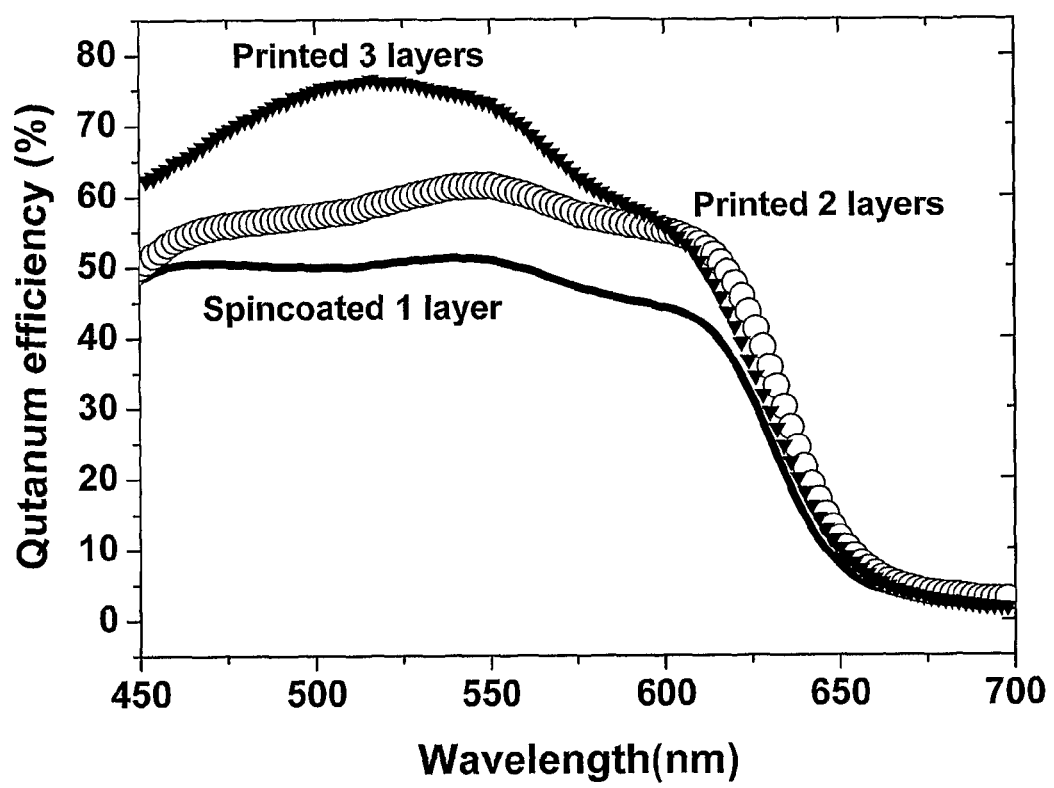
FIG. 7 shows the spectrally resolved quantum efficiency curves for each of the three photodiodes of FIG. 6.

FIG. 7 shows the quantum efficiency spectra of the single, bi-, and tri-layer diode structures. The same lines and symbols are used to identify the three different device structures as were used in FIG. 6. The quantum efficiency increases with layer number. The efficiency peak for the bi-layer diode spectrum is similar to that of the single-layer diode spectrum. There is however a 10% increase in quantum efficiency, indicating an improved charge collection efficiency.

The 10% further increase in efficiency of the tri-layer diode compared to the bi-layer diode (and therefore an increase of 20% compared to the single layer diode) is accompanied by a spectral shift in quantum efficiency peak relative to the other two diodes. The tri-layer diode peak response is located at 500-550 nm, which indicates a contribution from the F8BT:PCBM layer to photogeneration. These results demonstrate the opportunities to fabricate improved devices that are enabled by the printing method of the invention. Multilayer architectures can allow higher level engineering of function as, for instance, is routinely done for vacuum deposited small molecule devices. The thickness and composition ratios of the active layers in these demonstration devices have not been optimized yet, and even better performance might therefore be anticipated should such optimization be undertaken.

In addition to its application to producing integrated polymer electronic devices such as bi- or tri-layer polymer photodiodes with high quantum efficiencies and relatively low leakage currents, the method of the present invention has many other potential application areas. These include the use of 2D patterned polymer layers as barriers for wet or dry etching, the patterning of gratings and waveguides for advanced photonic applications, and the fabrication of polymer transistors, and organic LED's (OLED's) for displays (including multicolor displays) and other light sources.

Although the foregoing description of the present invention has been shown and described with reference to particular embodiments and applications thereof, it has been presented for purposes of illustration and description and is not intended to be exhaustive or to limit the invention to the particular embodiments and applications disclosed. It will be apparent to those having ordinary skill in the art that a number of changes, modifications, variations, or alterations to the invention as described herein may be made, none of which depart from the spirit or scope of the present invention. The particular embodiments and applications were chosen and described to provide the best illustration of the principles of the invention and its practical application to thereby enable one of ordinary skill in the art to utilize the invention in various embodiments and with various modifications as are suited to the particular use contemplated. All such changes, modifications, variations, and alterations should therefore be seen as being within the scope of the present invention as determined by the appended claims when interpreted in accordance with the breadth to which they are fairly, legally, and equitably entitled.

The invention claimed is:

1. A method for depositing one or more organic layers onto a substrate, comprising:
    transferring the one or more organic layers from a depositing surface of a stamp to the substrate by bringing the layer coated depositing surface of the stamp into contact with the substrate; and
    the step of contacting the one or more organic layers with a plasticizer, wherein the plasticizer is deposited on the surface of the substrate on which the organic layer is to be transferred prior to transferring the one or more organic layers from a depositing surface of a stamp to the substrate.

2. The method defined in claim 1, wherein the one or more organic layers transferred to the substrate are planar.

3. The method defined in claim 1, wherein the one or more organic layers transferred to the substrate are spatially patterned.

4. The method defined in claim 3, wherein the one or more organic layers are transferred from a planar stamp surface having been patterned thereon prior to transfer to the substrate.

5. The method defined in claim 4, wherein an initially uniformly coated organic layer on a planar stamp surface is patterned via the removal of material by transfer to a secondary stamp patterned with the negative replica of the desired pattern.

6. The method defined in claim 4, wherein an initially uniformly coated organic layer on a planar stamp surface is patterned via the removal of material by micro-and/or nano-fabrication techniques.

7. The method defined in claim 1, wherein the one or more organic layers transferred to the substrate are of thickness 1nm to 1μm, more preferably of thickness 4 nm to 150 nm, and most preferably of thickness 10 nm to 100 nm.

8. The method defined in claim 3, wherein the one or more organic layers are transferred from a structured stamp surface.

9. The method defined in claim 8 wherein the stamp surface is structured by molding on the surface of one of a plurality of hard materials, including Si and glass, previously patterned by a micro- and/or nano-fabrication technique including a variety of lithographies with dry or wet etching, and focused laser, electron- or ion-beam direct writing.

10. The method defined in claim 1, wherein the substrate is a solid material which may be selected from the group consisting of a plastic sheet or plate, a glass sheet or plate, and a metal sheet or plate.

11. The method defined in claim 1, wherein either the substrate or the stamp with the organic layer to be transferred is heated to facilitate the transfer of the one or more organic layers to the substrate.

12. The method defined in claim 11, wherein the temperature used to facilitate the transfer of the one or more organic layers from the stamp to the substrate is close to the glass transition temperature of the one or more organic layers.

13. The method defined in claim 11, wherein the temperature used to facilitate the transfer of the one or more organic layers from the stamp to the substrate is below 200° C. and preferably below 150° C.

14. The method defined in claim 11, wherein the heating is performed by thermal contact with a resistive heater.

15. The method defined in claim 11, wherein the heating is performed by an optical method.

16. The method defined in claim 11, wherein the heating is carried out over a time period of between 1 and 300 s.

17. The method defined in claim 1, wherein the stamp consists partially or wholly of an elastomeric polymer material.

18. The method defined in claim 17, wherein the elastomeric polymer material is partially or wholly comprised of polydimethylsiloxane or a related siloxane polymer.

19. The method defined in claim 17, wherein the elastomeric polymer material is surface modified, preferably by exposure to liquid, vapor, plasma, or irradiation, prior to coating with the one or more organic layers to be transferred.

20. The method defined in claim 17, wherein the elastomeric polymer material is coated with the one or more organic layers to be transferred by a method selected from the group consisting of spin-coating, blade-coating, and ink-jet, screen, and contact printing.

21. The method defined in claim 1, wherein a plasticizer is used to facilitate the transfer of the one or more organic layers from the stamp to the substrate.

22. The method defined in claim 21, wherein the plasticizer is blended with, or otherwise incorporated into, the one or more organic layers to be transferred.

23. The method defined ion claim 21, wherein the plasticizer consists of a hydrophilic liquid or a substance soluble in water.

24. The method defined ion claim 21, wherein the plasticizer consists of a hydrophobic liquid or a substance soluble in organic solvents.

25. The method defined in claim 1, wherein the plasticizer is deposited by a method selected from the group consisting of spin-coating, blade-coating, and ink-jet, screen, and contact printing.

26. The method defined in claim 1, wherein a plurality of organic layers are deposited via multiple depositions of planar and/or patterned layers from one or more stamps.

27. The method defined in claim 1, wherein the one or more organic layers to be deposited consist of one or more polymers, which expresses, either in the singular or combined form, a semi-conducting nature.

28. The method defined in claim 27, wherein the one or more organic layers consist of material that is soluble in water or hydrophilic solvents.

29. The method defined in claim 27, wherein the one or more organic layers consist of material that is soluble in organic or hydrophobic solvents.

30. The method defined in claim 1, wherein the one or more organic layers to be deposited consist of one or more polymers, which expresses, either in the singular or combined form, a conducting nature.

31. The method defined in claim 1, wherein the one or more organic layers to be deposited consist of one or more polymers, which expresses, either in the singular or combined form, an insulating dielectric nature.

32. The method defined in claim 1, wherein the one or more organic layers to be deposited consist of one or more polymers, which expresses, either in the singular or combined form, a passive optical function such as guiding, routing, diffracting, or otherwise modulating the propagation of light.

33. The method defined in claim 1, wherein the one or more organic layers to be deposited consist of one or more polymers, which expresses, either in the singular or combined form, an active optical function such as emitting, amplifying, switching, mixing, or otherwise modulating the wavelength and/or intensity of light.

34. The method defined in claim 1, wherein the one or more organic layers to be deposited consist of one or more polymers and one or more molecules, which expresses as a mixture a semi-conducting nature, or a conducting nature, or an insulating dielectric nature, and/or a passive or an active optical function.

35. The method defined in claim 1, wherein the one or more organic layers to be deposited consist of one or more polymers and one or more nanoparticles, which expresses as a mixture a semi-conducting nature, or a conducting nature, or an insulating dielectric nature, and/or a passive or an active optical function.

36. The method defined in claim 1, wherein the one or more organic layers to be deposited consist of one or more polymers and one or more colloids, which expresses as a mixture a semi-conducting nature, or a conducting nature, or an insulating dielectric nature, and/or a passive or an active optical function.

37. The method defined in claim 1, wherein the one or more organic layers to be deposited consist of one or more polymers and one or more flakes or other fillers, which expresses as a mixture a semi-conducting nature, or a conducting nature, or an insulating dielectric nature, and/or a passive or an active optical function.

38. The method defined in claim 1, wherein the one or more organic layers to be deposited consist of one or more polymers and two or more selected from the group consisting of molecules, nanoparticles, colloids, flakes, and other fillers, which expresses as a mixture a semi-conducting nature, or a conducting nature, or an insulating dielectric nature, and/or a passive or an active optical function.

39. A device structure that contains at least one organic layer fabricated according to claim 1.

40. The device structure defined in claim 39, in which the device structure is selected from the group consisting of a light emitting diode for lighting or display applications, a photodiode for photodetection or solar energy conversion applications, a transistor for radio frequency identification (RFID) or display driving applications, a laser or optical amplifier or optical switch for data- or tele-communication applications, a light source and detector integrated with a microfluidic channel for sensing applications, and a memory element for data storage applications.

41. An array of device structures that contain at least one organic layer fabricated according to claim 1.

42. The array of device structure defined in claim 41, wherein the array of device structures is selected from the group consisting of an array of light emitting diodes for lighting or display applications, an array of photodiodes for photodetection or solar energy conversion applications, an array of transistors for radio frequency identification (RFID) or display driving applications, an array of lasers or optical amplifiers or optical switches for data- or tele-communication applications, an array of light sources and detectors integrated with an array of microfluidic channels for sensing applications, and an array of memory elements for data storage applications.

43. The method defined in claim 1, wherein transfer of the one or more organic layers enables subsequent fabrication processes to be performed.

44. The method defined in claim 43, in which a transferred patterned organic layer acts as an etch mask.

45. The method defined in claim 1, additionally comprising the step of:
heating the substrate and/or the stamp in order to create favorable conditions for conformal contact and uniform layer transfer.

46. A method for depositing one or more organic layers onto a substrate, comprising:
depositing a plasticizer onto a surface of the substrate;
if the plasticizer deposited on the substrate contains a solvent, heating the substrate sufficiently to remove any solvent without damaging the plasticizer;
depositing the one or more organic layers onto a depositing surface of a stamp;
transferring the one or more organic layers from the depositing surface of the stamp to the surface of the substrate on which the plasticizer was deposited by bringing the depositing surface of the stamp having the one or more organic layers deposited thereupon into contact with the surface of the substrate on which the plasticizer was deposited;
heating the substrate and/or the stamp to create facilitate conformal contact and uniform transfer of the one or more organic layers from the depositing surface of the stamp to the substrate; and
removing the stamp from the substrate leaving the one or more organic layers attached to the substrate.

47. A method for depositing one or more organic layers onto a substrate, comprising:
depositing a plasticizer onto a surface of the substrate;
if the plasticizer deposited on the substrate contains a solvent, heating the substrate sufficiently to remove any solvent without damaging the plasticizer;
preparing a depositing surface of a patterned stamp for deposition of the one or more organic layers thereupon;
depositing the one or more organic layers onto the depositing surface of the stamp;
removing unneeded sections of the one or more organic layers from the depositing surface of the stamp and discarding the same;
transferring the one or more organic layers from the depositing surface of the stamp to the surface of the substrate on which the plasticizer was deposited by bringing the depositing surface of the stamp having the one or more organic layers deposited thereupon into contact with the surface of the substrate on which the plasticizer was deposited;

heating the substrate and/or the stamp to create facilitate conformal contact and uniform transfer of the one or more organic layers from the depositing surface of the stamp to the substrate; and removing the stamp from the substrate leaving the one or more organic layers attached to the substrate.

* * * * *